(12) United States Patent
Morrison (10) Patent No.: US 7,323,772 B2
(45) Date of Patent: Jan. 29, 2008

(54) BALL GRID ARRAY STRUCTURES AND TAPE-BASED METHOD OF MANUFACTURING SAME

(75) Inventor: Michael W. Morrison, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/233,294

(22) Filed: Aug. 28, 2002

(65) Prior Publication Data

US 2004/0041166 A1 Mar. 4, 2004

(51) Int. Cl.
H01L 23/48 (2006.01)
(52) U.S. Cl. .................................................... 257/692
(58) Field of Classification Search ........ 257/734–738, 257/678, 690–694; 438/117–118
See application file for complete search history.

(56) References Cited

U.S. PATENT DOCUMENTS

| | | | |
|---|---|---|---|
| 5,206,536 A * | 4/1993 | Lim ........................... 257/668 |
| 5,227,232 A * | 7/1993 | Lim ........................... 428/344 |
| 5,400,218 A | 3/1995 | Val | |
| 5,677,566 A * | 10/1997 | King et al. ................. 257/666 |
| 5,844,168 A | 12/1998 | Schueller et al. | |
| 6,060,778 A | 5/2000 | Jeong et al. | |
| 6,078,506 A | 6/2000 | Sugahara | |
| 6,114,753 A | 9/2000 | Nagai et al. | |
| 6,144,102 A | 11/2000 | Amagai | |
| 6,268,650 B1 | 7/2001 | Kinsman et al. | |
| 6,300,165 B2 | 10/2001 | Castro | |
| 6,310,390 B1 | 10/2001 | Moden | |
| 6,323,065 B1 * | 11/2001 | Karnezos ..................... 438/122 |
| 6,365,439 B2 | 4/2002 | Miiyazaki et al. | |
| 6,372,552 B1 | 4/2002 | Kinsman et al. | |
| 6,385,049 B1 * | 5/2002 | Chia-Yu et al. ............. 361/721 |
| 6,400,574 B1 * | 6/2002 | Stephenson et al. ........ 361/760 |
| 6,462,274 B1 * | 10/2002 | Shim et al. .................. 174/535 |
| 6,509,643 B2 * | 1/2003 | Ohtaka et al. ............... 257/712 |
| 6,552,420 B1 | 4/2003 | Corisis | |
| 6,576,988 B2 * | 6/2003 | Corisis ........................ 257/676 |
| 6,791,194 B1 | 9/2004 | Nagai et al. | |
| 6,855,623 B2 * | 2/2005 | Ball ............................ 438/612 |
| 2001/0033021 A1 * | 10/2001 | Shimoishizaka et al. ..... 257/737 |
| 2002/0000656 A1 * | 1/2002 | Huang et al. ................ 257/736 |
| 2002/0171145 A1 * | 11/2002 | Higuchi et al. ............. 257/738 |
| 2003/0098502 A1 | 5/2003 | Sota | |
| 2003/0132518 A1 * | 7/2003 | Castro ......................... 257/707 |
| 2004/0004283 A1 * | 1/2004 | Yew et al. .................... 257/734 |
| 2004/0077129 A1 | 4/2004 | Smith et al. | |

* cited by examiner

*Primary Examiner*—Nathan W. Ha
(74) *Attorney, Agent, or Firm*—TraskBritt (57) ABSTRACT

Semiconductor device packages formed in accordance with methods of packaging semiconductor dice in grid array-type semiconductor device packages using conventional lead frame or lead lock tape assembly equipment are disclosed. Circuitry-bearing segments having an electrically insulating layer that carries redistribution circuitry and redistributed bond pads and which is supported from beneath by a support layer are secured to the active surface of a semiconductor die. The support layer may comprise an electrically conductive material, which may act as a heat sink or as a ground plane for the packaged semiconductor device. The methods provide increased accuracy with which segments are placed on a semiconductor die relative to the placement accuracies provided when pick-and-place equipment is used to position conventional grid array substrates relative to semiconductor dice.

34 Claims, 5 Drawing Sheets

BALL GRID ARRAY STRUCTURES AND TAPE-BASED METHOD OF MANUFACTURING SAME

BACKGROUND OF THE INVENTION

1. Field of the Invention

The present invention relates generally to methods of manufacturing semiconductor devices. More particularly, the present invention relates to tape-based methods of manufacturing semiconductor devices having so-called ball grid array connection patterns for electrically connecting a semiconductor die to an external device (e.g., a printed circuit board). The present invention also relates to so-called ball grid array (BGA) semiconductor device packages formed in accordance with the disclosed methods.

2. Background of the Related Art

The dimensions of electronic devices are ever-decreasing. Consequently, alternative methods of semiconductor device assembly and packaging are continually being provided to reduce the effective size of such devices. One such method provides for a decrease in the size of the "footprint" of the semiconductor device on higher-level packaging, substrates, or carrier substrates, such as printed circuit boards (PCBs) or printed wiring boards (PWBs). Semiconductor devices having grid array connection patterns are being fabricated with increasing frequency, as the manner in which such devices are electrically connected to carrier substrates reduces the surface area consumed by such devices on the carrier substrates to an area the same as, or only slightly larger than, the device dimensions. Semiconductor devices with grid array connection patterns, including BGA semiconductor device packages, provide improved surface mountability and greater package density as well.

Flip-chip semiconductor device packages are known in the art and, in general, include a semiconductor die having an active surface with bond pads thereon. An insulative layer, which may be formed of a resin material, is placed or deposited on the active surface of the semiconductor die and includes openings therein to expose the bond pads of the semiconductor die. Conductive traces in the form of a so-called "redistribution layer" (RDL) are patterned on the insulative layer in contact with the bond pads and solder balls or other electrically discrete conductive elements are placed at the ends of the traces opposite the bond pads on the top of the insulative layer. While the resulting semiconductor device is extremely compact, it is also somewhat delicate as the semiconductor die itself must be handled, rather than a supporting substrate.

It is known to fabricate a BGA package using a polymer substrate carrying conductive traces in the form of leads extending over a slot in the center thereof and adhesively bonded to the active surface of a semiconductor die, as disclosed in U.S. Pat. No. 6,310,390 to Moden, assigned to the assignee of the present invention. The bond pads on the semiconductor die may be connected to the cantilevered lead ends extending over the slot by thermocompression bonding and the leads may communicate signals from the wires to discrete conductive elements in the form of solder balls. By way of example, the layer may be formed of a polymer film element which may be adhered and cut from a larger film after the semiconductor die and others adhered to the film are otherwise assembled.

Several disadvantages to such packaging methods and semiconductor packages so assembled have been recognized. For instance, BGA semiconductor device packages manufactured by such a method are not structurally reinforced and, thus, may be difficult to handle. As a result, some manufacturing processes provide for structural reinforcement by providing a support layer on the bottom surface of the semiconductor die. These methods, however, increase the vertical profile of the devices, which is undesirable. A further disadvantage of typical BGA packages is poor heat dissipation and/or management. Failure to adequately manage heat may result in premature failure of the semiconductor device.

Various attempts have been made to overcome these difficulties. One such attempt is presented in U.S. Pat. No. 6,300,165 B2 to Castro (hereinafter the "'165 patent"), the disclosure of which is hereby incorporated herein by this reference as if set forth in its entirety herein. The '165 patent teaches an integrated circuit (semiconductor die) package substrate for use with a ball grid array, and method of manufacturing the same, wherein circuitry-bearing decals are applied directly to a rather large metal heat sink. The heat sink has a dielectric layer formed directly on a bottom surface thereof. A circuit pattern which will accommodate a ball grid array is formed on the dielectric layer. A plurality of these package substrates are formed adjacent one another and are supplied in the form of a lead frame segment. A single segment, on its dielectric layer, contains all of the circuitry desired for a series of semiconductor packages. Preferably, the segment is applied to multiple integrated circuit devices in succession in a width-wise, or transverse, direction with respect to the longitudinal axis of the segment. Subsequently, electrical connections are secured and the tape is cut at separation indicators located between the devices. The individual units are then singulated from the segment by conventional trim and form techniques and the segment is subject to a final cutting operation in which the lead frame rails are removed.

While the ball grid array substrate of the '165 patent provides improved rigidity and heat management, it has a number of drawbacks. For instance, since the circuitry-bearing dielectric layer of the '165 patent is secured directly to the heat sink, a polyimide PWB panel must be fabricated to carry the circuit traces. Fabrication requires milling and/or drilling of a wire bond slot, as well as tooling holes and alignment fiducials. Further, during singulation of the integrated circuit packages, either end milling or punch tooling must be used. Such additional process steps are undesirable. Additionally, machine placement of the segment on a series of semiconductor devices in this manner permits accuracies of only ±100 µm. This is somewhat undesirable as bond pads on semiconductor devices are often separated only by this degree of error and, thus, wire bond connections to the bond pads must be individually inspected for accuracy of wire bond placement. Further, the method of the '165 patent is a rather slow process, thus affecting throughput goals.

Another attempt at producing an improved BGA semiconductor device package is provided in U.S. Pat. No. 6,268,650 B1 to Kinsman et al. (hereinafter the "'650 patent"), the disclosure of which is hereby incorporated herein by this reference as if set forth in its entirety herein. The '650 patent teaches a semiconductor package formed of a semiconductor die having an electrically conductive layer and an insulating layer thereon which supports a ball grid array substrate. The conductive layer is formed of metal which provides structural support (stiffness) and also acts as a heat sink dissipating heat away from the die. An adhesive layer may be placed between the active surface of the die and the conductive layer to adhere the conductive layer to the semiconductor die. The ball grid array substrate is electrically connected to the die by wires, traces, and/or other conductive elements as known in the art. Additionally, one or more of the conductive elements may be connected to the conductive layer enabling the conductive layer to be used as a ground plane for the device.

A plurality of semiconductor packages of the '650 patent may be formed by a tape-based process and subsequently separated from one another. The tape structure, in one embodiment, is of an indefinite length and includes an upper insulating layer and a lower conductive metal layer. A single tape segment, on its insulating layer, contains all of the circuitry desired for a series of semiconductor packages and is preferably applied to multiple semiconductor devices in succession in a widthwise, or transverse, direction to the longitudinal extent of the tape segment. Subsequently, electrical connections accommodating a grid array connection pattern may be secured to the semiconductor die and the tape may be cut at separation indicators located between the devices to separate the individual packages from one another.

Semiconductor packages manufactured by the methods of the '650 patent provide improved rigidity and heat management relative to conventional BGA packages. However, this approach has certain drawbacks as well. For instance, because a single tape segment contains all of the circuitry desired for each of a series of semiconductor devices, machine placement thereof provides accuracies only within the same margin of error as the method of the '165 patent (i.e., ±100 µm). Again, this is undesirable, as bond pads are often separated only by this degree of error and, as such, wire bond connections to bond pads must be individually inspected for accuracy.

Upon consideration of the above-described state of the art, the inventor has recognized that a method of applying circuitry-bearing tape segments to the active surface of a semiconductor die which offers a placement accuracy statistically improved over ±100 µm would be desirable. Further, the inventor has recognized that a method of fabricating semiconductor devices using conventional lead frame attach equipment (e.g., leads-over-chip (LOC) and lead lock tape assembly equipment) to attach circuitry-bearing tape segments to the active surface of a semiconductor device would provide enhanced placement accuracy and associated higher yield. Further, the resulting semiconductor devices would exhibit improved thermal, electrical and rigidity properties over the current state of the art.

SUMMARY OF THE INVENTION

The present invention includes circuitry-bearing tape for forming a ball grid array on an active surface of a semiconductor die. The circuitry-bearing tape includes a first tape segment with a first circuit portion patterned thereon and a second tape segment with a second circuit portion patterned thereon. A combination of the first and second circuit portions comprises a complete circuit and connection pattern for a semiconductor die configured for accommodating a grid array or other connection pattern which may be used in forming BGA- and other grid array-type devices. Each tape segment may comprise an electrically insulating layer bearing circuit traces formed thereon, an adhesive layer and a support layer, which may comprise an electrically conductive layer, positioned therebetween. The support layer may be formed of a rigid or semi-rigid material, such as a conductive metal, (e.g., copper) and may provide structural support for the semiconductor die. Further, if used, an electrically conductive support layer may, due to its thermal conductivity, act as a heat sink for the semiconductor die dissipating heat therefrom. Still further, an electrically conductive support layer may act as an internal ground plane for the resulting device if an electrical connection is made directly between the active surface of the semiconductor die and the electrically conductive support layer.

The present invention further includes a method of applying circuitry providing a ball grid array I/O pattern to an active surface of a semiconductor die. The method includes providing a first tape segment having a first circuit portion thereon and a second tape segment having a second circuit portion thereon. A combination of the first and second circuit portions forms a complete circuit pattern and a corresponding grid array connection pattern or other suitable array-type connection pattern. The method further includes positioning each tape segment over and securing the same to the active surface of the semiconductor die, forming or positioning solder balls or other electrically discrete conductive elements (e.g., balls, bumps, columns, or pins of conductive material, such as a metal, metal alloy, or conductive or conductor-filled elastomer) on redistributed bond pads of the circuit pattern and electrically connecting the circuitry of the tape segments to bond pads on the active surface of the semiconductor die. Alternatively, an anisotropic, Z-axis conductive film may be used in lieu of discrete conductive elements. Each tape segment comprises an electrically insulating layer having the respective circuit patterns and redistributed bond pads thereon and a support layer, which may be electrically conductive, underlying the electrically insulating layer. Optionally, each tape segment may further comprise an adhesive layer or an adhesive-bearing layer, either of which is electrically insulating so as to electrically isolate an electrically conductive support layer from the active surface of the semiconductor die. In this embodiment, the electrically conductive support layer may be positioned between the adhesive or adhesive-bearing layer and the electrically insulating layer.

Still further, the present invention includes a method for packaging a semiconductor die. The method comprises providing a plurality of layered tape segments, each segment including an electrically insulating layer, an adhesive layer and a support layer, which may be electrically conductive, located therebetween. The method further includes patterning at least one circuit on a top surface of the electrically insulating layer which includes at least one conductive trace extending from at least one redistributed bond pad in electrical communication therewith. Further, the method comprises providing a semiconductor die having an active surface with at least one bond pad thereon, securing each tape segment to the active surface such that the at least one wire bond pad is not covered by the segments, forming or positioning electrically discrete conductive elements on redistributed bond pads on the top surface of the electrically insulating layer and electrically connecting circuitry on the tape segment to the bond pads of the die to form a semiconductor package. If desired, an additional bond pad on the active surface may be electrically connected to the electrically conductive support layer to create an internal ground plane for the semiconductor package. As the circuitry is embodied as a portion of an elongate segment, conventional LOC lead frame attach equipment may be used to assemble each segment with a semiconductor die and to electrically connect bond pads of the semiconductor die to corresponding redistribution bond pads of the segment. After all electrical connections have been made, the connections between the bond pads and conductive traces may be encapsulated and the semiconductor die may also be encapsulated, if desired.

In addition, the present invention includes semiconductor device assemblies and packages, including, but not limited to, BGA and other grid array type semiconductor device assemblies and packages, that are formed in accordance with the above methods.

Additional aspects of the invention, together with the advantages and novel features appurtenant thereto, will be set forth in the description which follows and will also become readily apparent to those of ordinary skill in the art upon examination of the following and from the practice of the invention.

BRIEF DESCRIPTION OF THE DRAWINGS

In the accompanying drawings, which form a part of the specification and are to be read in conjunction therewith, and wherein like reference numerals refer to like parts in the various views.

DETAILED DESCRIPTION OF THE INVENTION

The present invention is directed to tape-based methods for providing semiconductor devices having ball grid array-type circuitry for electrically connecting integrated circuits of semiconductor dice to external devices, such as carrier substrates configured as printed circuit or wiring boards. The present invention is also directed to semiconductor device packages, including ball grid array semiconductor device packages, formed in accordance with the disclosed methods. The particular embodiments described herein are intended in all respects to be illustrative rather than restrictive. Alternative embodiments will become apparent to those of ordinary skill in the art to which the present invention pertains without departing from its scope.

Figure 3:
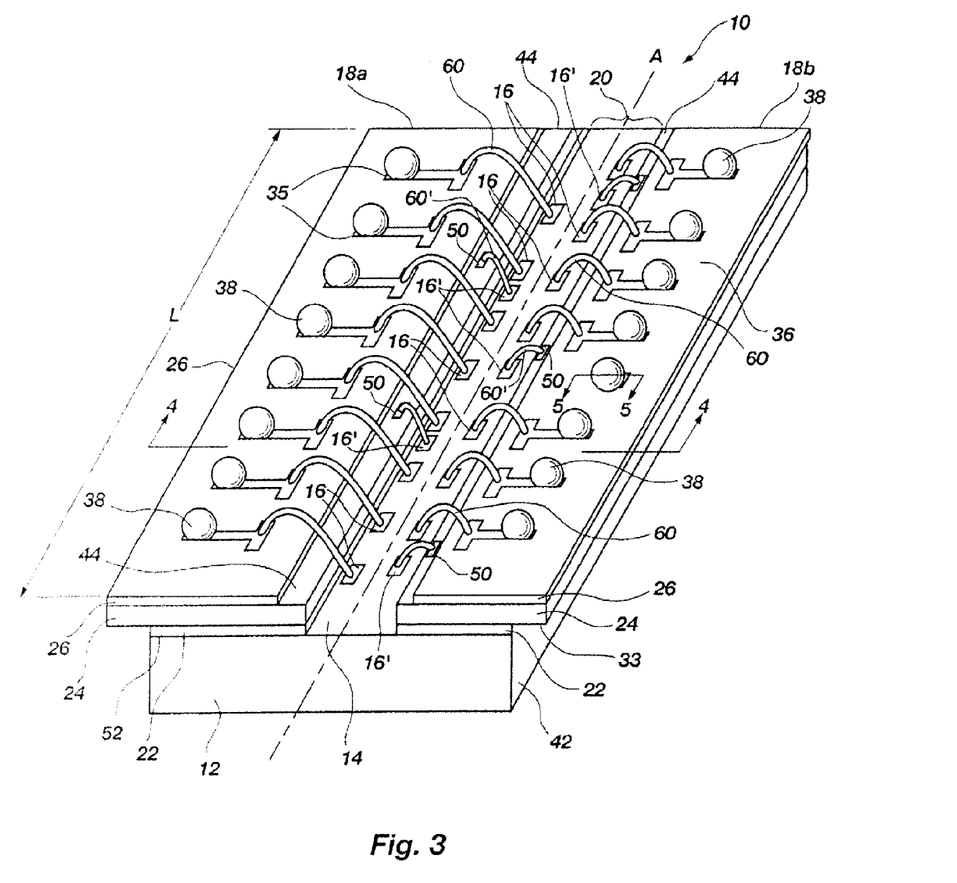
FIG. 3 is a perspective view of a semiconductor package constructed in accordance with the methods of the present invention.

Referring initially to FIG. 3, a semiconductor device 10 of the present invention includes a semiconductor die 12 having an active surface 14 including integrated circuits (not shown). The integrated circuits are in electrical communication with bond pads 16 on the active surface 14 of the semiconductor die 12, as more fully described below.

Two complementary segments 18a, 18b (also collectively referred to as segments 18) of circuitry-bearing tape are positioned over and secured to the active surface 14. The segments 18a, 18b are spaced from one another on opposite lateral sides of the active surface 14 and extend the length L of the semiconductor die 12 in substantially parallel orientation to one another. A central region 20 of the semiconductor die 12, on which the bond pads 16 are carried, is exposed between the segments 18a and 18b. As shown in the exemplary embodiment of FIGS. 1 and 2, the segments 18 of circuitry-bearing tape may include a rigid (or semirigid) support layer 24 and an electrically insulating layer 26, such as a film or laminate layer. Each tape segment 18 may, for example, be between 1 mm and 3 mm in width.

Two complementary segments 18a, 18b (also collectively referred to as segments 18) of circuitry-bearing tape are positioned over and secured to the active surface 14. The segments 18a, 18b are spaced from one another on opposite lateral sides of the active surface 14 and extend the length L of the semiconductor die 12 in substantially parallel orientation to one another. A central region 20 of the semiconductor die 12, on which the bond pads 16 are carried, is exposed between the segments 18a and 18b. As shown in the exemplary embodiment of FIGS. 1 and 2, the segments 18 of circuitry-bearing tape may include a rigid (or semirigid) support layer 24 and an electrically insulating layer 26, such as a film or laminate layer. Each tape segment 18 may, for example, be between 1 mm and 3 mm in width.

Upon assembly of a semiconductor device 10 according to the present invention, an adhesive layer 22 may be used to secure a segment 18 to the active surface 14 of the semiconductor die 12. The adhesive layer 22 may be located on the support layer 24 of the segment 18 (e.g., as a coating thereon) or comprise a separate layer or coating positionable between the support layer 24 and a semiconductor die 12 to which the segment 18 is to be secured. The adhesive layer 22 may be formed of a variety of suitable adhesive materials, including polyimide, thermoplastic and thermoset-type adhesive materials, as well as ultraviolet-activated adhesives. The adhesive layer 22 may alternatively be formed of an epoxy or of a pressure-sensitive adhesive. The adhesive layer 22 may be provided in liquid or gel form, in preformed segments, or as a double-sided adhesive-coated tape segment. If an epoxy, the adhesive may be cured to a tacky or so-called "B" stage prior to assembly of a segment 18 with a semiconductor die. Further, a so-called "snap-cure" epoxy, having a cure time in seconds may also be employed. If an adhesive layer 22 is preapplied to segments 18, it may, of course, be covered with a removable protective liner that may be stripped off as each segment 18 is applied to a semiconductor die 12, as described further below.

Figures 6, 7:
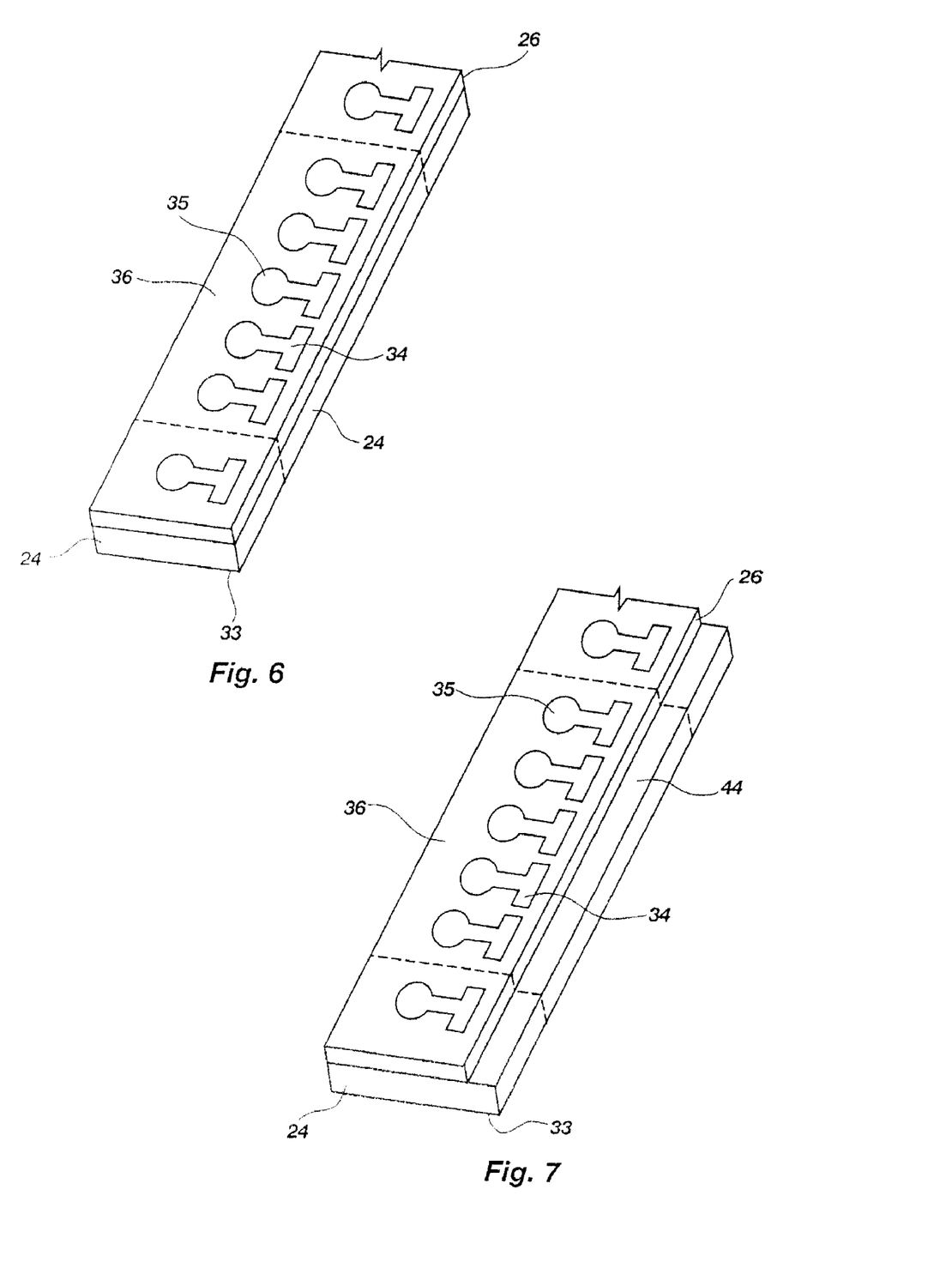
FIG. 6 is a perspective view of a circuitry-bearing tape segment according to the present invention which is devoid of an adhesive layer.
FIG. 7 is a perspective view of a circuitry-bearing tape segment in accordance with yet another embodiment of the present invention in which an adhesive layer is not provided as part of the tape structure.

It will be understood by those of ordinary skill in the art that the segments 18 of the present invention may be formed without adhesive layer 22. In this variation, shown in FIGS. 6 and 7, a suitable adhesive may be applied to either the active surface 14 of the semiconductor die 12 (not shown) or to the bottom surface 33 of the support layer 24 by the user prior to assembly. Such alternative is contemplated to be within the scope of the present invention.

Figure 1:
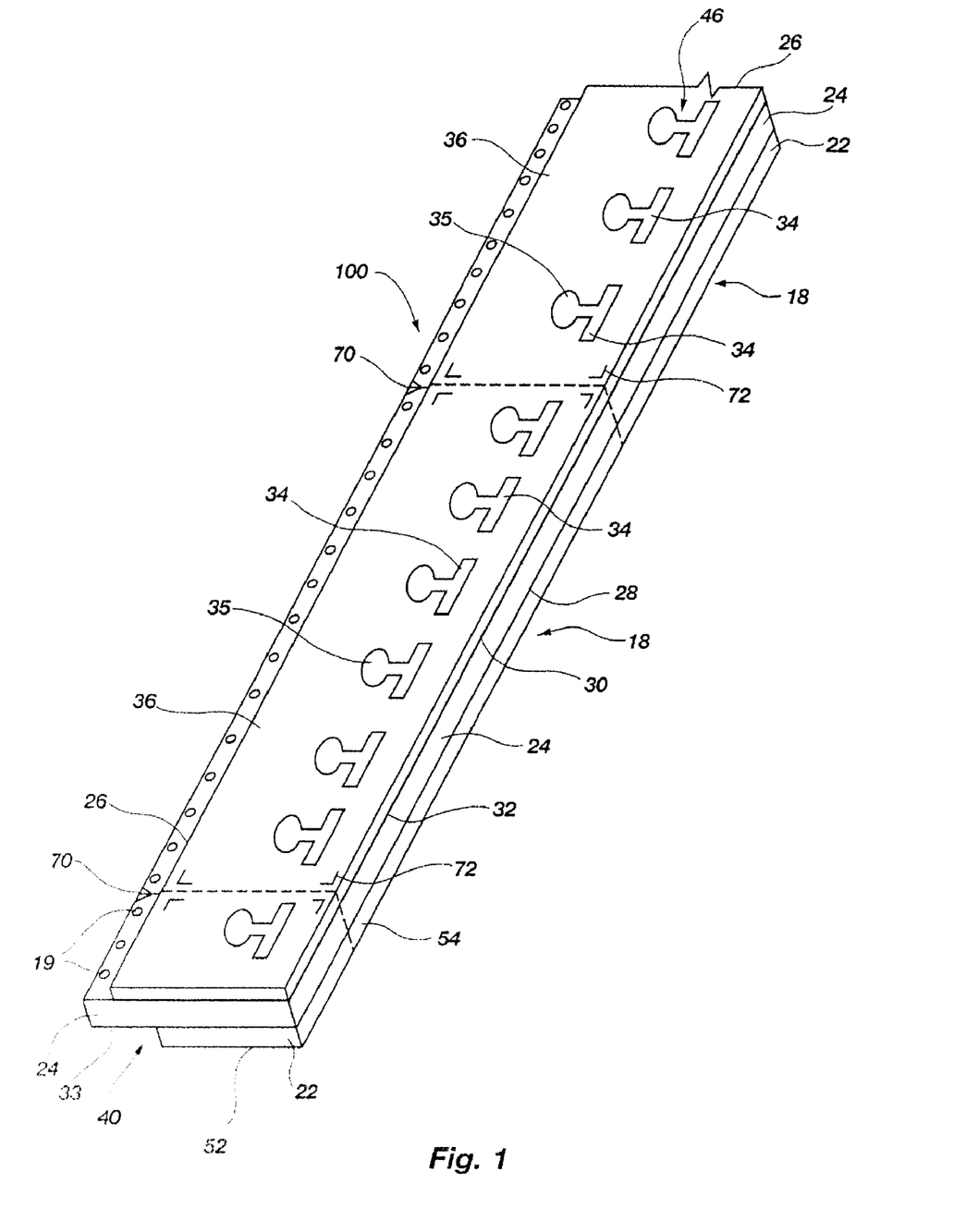
FIG. 1 is a perspective view of a circuitry-bearing segment of tape in accordance with the present invention.

Referring again to FIG. 3, as well as to FIG. 1, the support layer 24 of each circuitry-bearing tape segment 18 is located between a top surface 28 (not shown in FIG. 3) of the adhesive layer 22 and a bottom surface 30 of the electrically insulating layer 26. The support layer 24 may comprise an electrically insulating material, such as glass, ceramic, a resin (e.g., BT resin, etc.), a laminate such as FR-4 or FR-5, a polymer, such as a polyimide, or an electrically conductive material, such as copper or aluminum. The support layer 24 may be of sufficient rigidity to structurally support electrically insulating layer 26 and the circuitry thereon without the need for a separate support structure. The support layer 24 may be formulated so as not to substantially expand or contract, even when subjected to extreme temperatures or to expand and contract substantially at the same rate as semiconductor die 12. The support layer 24 may also include indexing holes 19 (FIG. 1) along an edge thereof so as to facilitate placement of a segment 18 including the same and electrical connection thereof to a semiconductor die 12 by way of conventional LOC or lead-lock tape assembly equipment.

Electrically conductive traces 34 (not shown in FIG. 3) and corresponding redistributed bond pads 35 may be patterned on the top surface 36 of the electrically insulating layer 26 of each segment 18. As shown, redistributed bond pads 35 are arranged in a so-called "grid array" connection pattern, although other arrangements and, thus, connection patterns are also within the scope of the present invention. By way of example, and not limitation, the electrically conductive traces 34 and redistributed bond pads 35 may be formed by providing an electrically insulating layer 26 with one or more layers of conductive material laminated thereon or depositing one or more layers of conductive material (e.g., copper (Cu), aluminum (Al), another suitable conductive material, or a combination thereof) on the top surface 36 of the electrically insulating layer 26, followed by patterning the layer or layers of conductive material (e.g., by mask and etch techniques) according to methods known in the art. Additional placing of one or more layers of metal on redistributed bond pads 35 may then be effected, as known in the art, to enhance wettability or adherence of solder balls or other discrete conductive elements 38.

Electrically conductive traces 34 (not shown in FIG. 3) and corresponding redistributed bond pads 35 may be patterned on the top surface 36 of the electrically insulating layer 26 of each segment 18. As shown, redistributed bond pads 35 are arranged in a so-called "grid array" connection pattern, although other arrangements and, thus, connection patterns are also within the scope of the present invention. By way of example, and not limitation, the electrically conductive traces 34 and redistributed bond pads 35 may be formed by providing an electrically insulating layer 26 with one or more layers of conductive material laminated thereon or depositing one or more layers of conductive material (e.g., copper (Cu), aluminum (Al), another suitable conductive material, or a combination thereof) on the top surface 36 of the electrically insulating layer 26, followed by patterning the layer or layers of conductive material (e.g., by mask and etch techniques) according to methods known in the art. Additional placing of one or more layers of metal on redistributed bond pads 35 may then be effected, as known in the art, to enhance wettability or adherence of solder balls or other discrete conductive elements 38.

Referring now to FIG. 1, an embodiment of a circuitry-bearing tape 100 including a plurality of segments 18 of the present invention is shown. In the stacked arrangement of the electrically insulating layer 26, the support layer 24, and the adhesive layer 22 shown in FIG. 1, the electrically insulating layer 26 and the support layer 24 extend laterally beyond the adhesive layer 22 and may also extend laterally beyond an outer periphery 42 of a semiconductor die 12 (FIG. 3) with which a segment 18 is to be assembled. The width of the support layer 24 and the width of the electrically insulating layer 26 may be substantially equal to one another and greater than the width of the adhesive layer 22. Optionally, if the support layer 24 includes indexing holes 19 along an edge thereof, the support layer 24 may initially be wider than the electrically insulating layer 26, then trimmed following assembly of a segment 18 with a semiconductor die 12 to substantially the same width as the electrically insulating layer 26. Accordingly, an overhang region 40 is provided, which is substantially supported by the rigidity of the electrically conductive support layer 24. This configuration permits the circuitry (i.e., electrically conductive traces 34 and redistributed bond pads 35) of a segment 18 to extend laterally beyond the outer periphery 42 of a semiconductor die 12 (FIG. 3), as more fully described hereafter. This arrangement may be advantageous, for example, where the desired footprint or grid connection pattern for a semiconductor device 10 (FIG. 3) exceeds the surface area of the semiconductor die 12 thereof or where additional area on the top surface 36 of the electrically insulating layer 26 is desired or required to accommodate the array of solder balls 38 or other electrically discrete conductive elements in the desired positions for communication with one or more external devices, such as PCBs, PWBs or other higher-level packaging.

Figure 2:
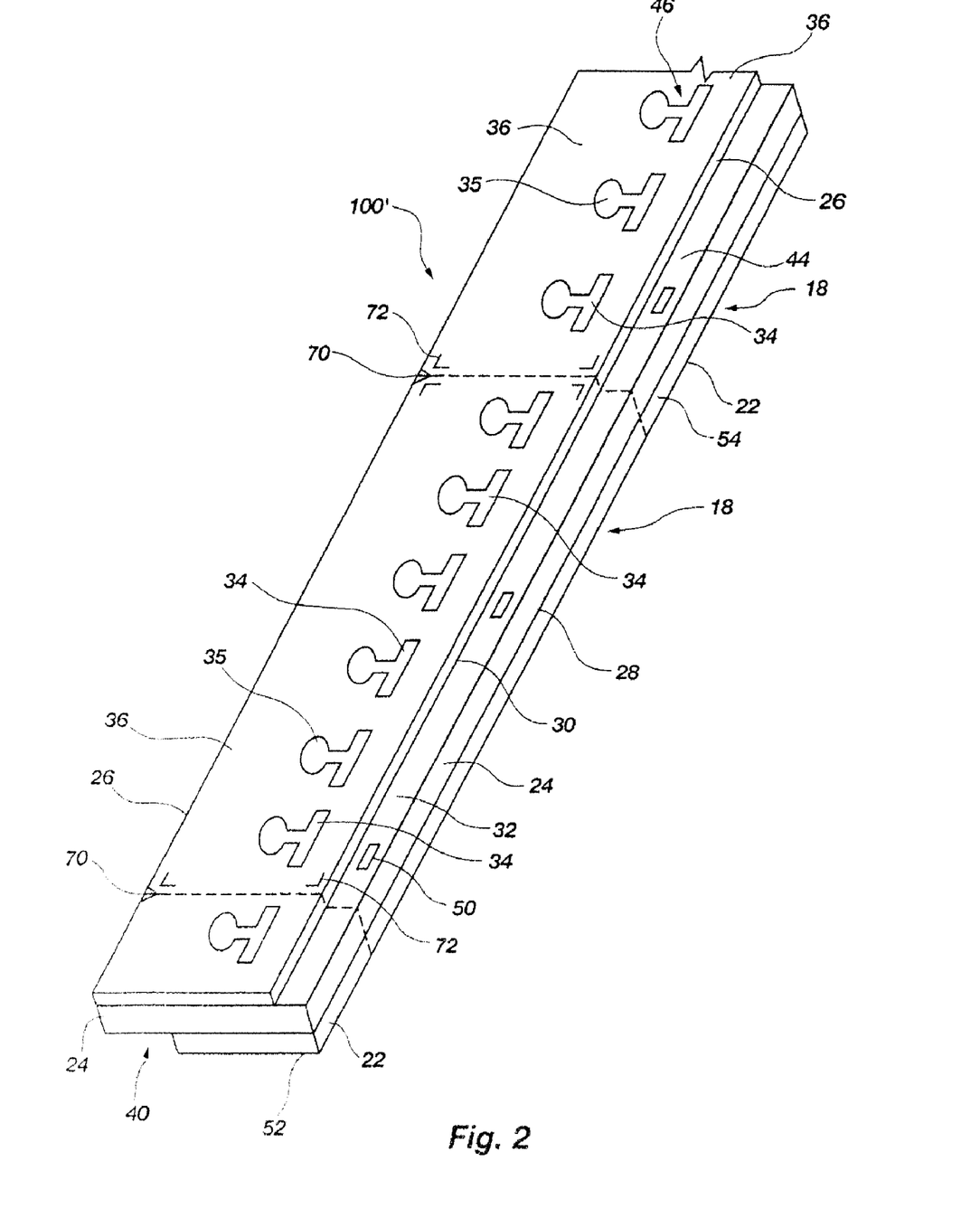
FIG. 2 is a perspective view of a circuitry-bearing segment of tape in accordance with another embodiment of the present invention.

With reference to FIG. 2, another embodiment of a circuitry-bearing tape 100' including a plurality of segments 18 of the present invention is shown. The circuitry-bearing tape 100' of FIG. 2 includes an overhang region 40, as shown in FIG. 1. However, in the tape segments 18 of FIG. 2, the width of the support layer 24 and the width of the electrically insulating layer 26 are not substantially equal to one another. Rather, the width of the support layer 24 exceeds that of the electrically insulating layer 26 and, thus, the support layer 24 may laterally extend beyond the electrically insulating layer 26. As shown, the support layer 24 extends beyond the electrically insulating layer 26 at an opposite side of the segment 18 from that at which the overhang region 40 is located. When the support layer 24 is formed from a conductive material, such arrangement provides an exposed conductive region 44 which extends the length of a circuitry-bearing tape segment 18 and is to be located laterally adjacent to a central portion of the active surface 14 of a semiconductor die 12 upon assembly of the segment 18 with the semiconductor die 12. The adhesive layer 22 may also extend laterally beyond the electrically insulating layer 26 in the same lateral dimension as the support layer 24 and terminates in such dimension coextensively with the support layer 24, as shown.

The electrically insulating layer 26 may be formed on or secured to the support layer 24 by, first, treating the top surface 32 of a preformed support layer 24 with an adhesion promoter, as known in the art. An adhesion promoter suitable for use with the material of the support layer 24 and which roughens, oxidizes, or otherwise facilitates adhesion of electrically insulating layer 26 to top surface 32 thereof may be used. The electrically insulating layer 26 may be formed directly on the top surface 32 of the support layer 24 or a preformed electrically insulating layer may be applied to the top surface 32 with or without the use of an intervening adhesive and bonded thereto. As quoted above, the electrically conductive traces 34 and redistributed bond pads 35 may be formed in a desired circuit pattern on the top surface 36 of the electrically insulating layer 26, as known in the art.

The electrically insulating layer 26 may be formed on or secured to the support layer 24 by, first, treating the top surface 32 of a preformed support layer 24 with an adhesion promoter, as known in the art. An adhesion promoter suitable for use with the material of the support layer 24 and which roughens, oxidizes, or otherwise facilitates adhesion of electrically insulating layer 26 to top surface 32 thereof may be used. The electrically insulating layer 26 may be formed directly on the top surface 32 of the support layer 24 or a preformed electrically insulating layer may be applied to the top surface 32 with or without the use of an intervening adhesive and bonded thereto. As quoted above, the electrically conductive traces 34 and redistributed bond pads 35 may be formed in a desired circuit pattern on the top surface 36 of the electrically insulating layer 26, as known in the art.

As shown in FIGS. 1 and 2, circuitry-bearing tapes 100 and 100' of the present invention may be formed to any suitable length and may include a plurality of segments 18 thereon, each segment 18 being placed upon successive semiconductor dice 12 on assembly and subsequently separated from the other segments 18 of that circuitry-bearing tape 100 or 100'. The segments 18 to be applied to opposing sides of the active surfaces 14 of semiconductor dice 12 may have the same or different patterns of electrically conductive traces 34 and/or redistributed bond pads 35 thereon, as desired. Of course, circuitry-bearing tape 100 and 100' may be configured for use with any desired bond pad arrangement and to provide a suitable array of I/O locations to be bumped. A dashed line 70 indicates the location of the separation between adjacent segments 18 in each of FIGS. 1 and 2. Upon assembly, circuitry-bearing tapes 100 or 100' may be cut at locations along or near the dashed lines 70 by conventional methods including and, optionally, using machine vision equipment to locate the appropriate locations at which such cutting is to be effected, as described hereafter.

At this stage, the circuitry-bearing tape 100 or 100' may be stored as desired until use. The circuitry-bearing tape 100 or 100' may be stored flat or rolled onto a tape reel prior to storage and/or use. A variety of tape reels known in the art may be used including, but not limited to, conventional lead lock tape reels. Optionally, if the circuitry-bearing tape 100 or 100' includes an adhesive layer 22, a removable liner (not shown) may be used to cover the bottom surface 52 of the adhesive layer 22. Such option may be desirable, for instance, where a pressure-sensitive adhesive is used to form adhesive layer 22.

The circuitry-bearing tape 100 or 100' of the invention may be further processed by the user to package a semiconductor die 12 in accordance with teachings of the invention. The active surface 14 of the semiconductor die 12 and the support layer 24 of segments 18 may be secured to one another by way of the adhesive layer 22. If the adhesive layer 22 is presecured to the support layer 24 and a removable liner (not shown) is used to cover the exposed surface of the adhesive layer 22, the liner is removed prior to attaching the semiconductor die 12 to the bottom surface 52 of the adhesive layer 22. The outside lateral edge 54 of the adhesive layer 22 of each segment 18 of circuitry-bearing tape 100 or 100' may substantially align with the respective outer periphery 42 of the semiconductor die 12. Since the support layer 24 and the electrically insulating layer 26 may extend laterally beyond the adhesive layer 22 in one lateral dimension, as described above in reference to FIGS. 1-3, an overhang region 40 is created beyond the outer periphery 42 of the semiconductor die 12, at which the support layer 24 and the electrically insulating layer 26 extend laterally beyond the outer periphery 42.

The bond pads 16 of the semiconductor die 12 and their corresponding electrically conductive traces 34 of the segment 18 may be electrically connected by known techniques. Such techniques may include, without limitation, forming or positioning somewhat laterally extending intermediate conductive elements, such as bond wires, tape-automated bonding (TAB) elements comprising conductive traces carried upon a dielectric film, bonded leads (e.g., by thermocompression, sonic, or other processes), and the like between each bond pad 16 and its corresponding electrically conductive trace 34 or a contact pad (not shown) associated with an inner end at a electrically conductive trace 34 and in communication therewith. By way of example only, conventional wire bonding techniques may be used for providing electrical connection of the bond pads 16 of semiconductor die 12 to the electrically conductive traces 34 by intermediate conductive elements 60 (FIG. 3) made of an electrically conductive metal, such as gold (Au). If one or more ground bond wires 60' are to extend between a bond pad 16' and an electrically conductive support layer 24, intermediate conductive elements 60 (e.g., gold (Au) wires) may be bonded to the ground bond pad or pads 16' on the active surface 14 of the semiconductor die 12 and to one or more wire bond pads 50 of a suitable metallurgy formed on the exposed conductive region 44, or preferably directly to the exposed conductive region 44 of the electrically conductive support layer 24. Solder balls 38 or other discrete conductive elements may also be bonded, secured, or formed (e.g., by reflow of solder paste segments applied to redistributed bond pads 35) to the redistributed bond pads 35 formed on the top surface 36 of the electrically insulating layer 26.

Figure 5:
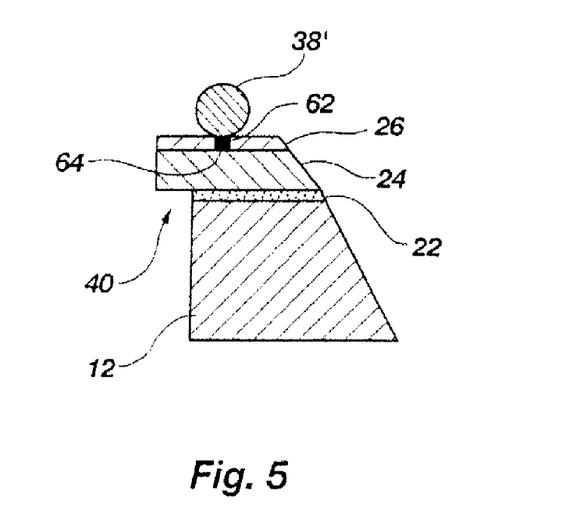
FIG. 5 is a cross-sectional view of the semiconductor package of FIG. 3, taken along line 5-5.

As best seen in FIG. 5, one or more additional solder balls 38' or other thermally conductive structures which are isolated from the circuit 46 (see FIGS. 1 and 2) may be bonded to one or more respective openings 62 formed in electrically insulating layer 26 to provide for thermal management and heat transfer to a carrier substrate or other higher-level packaging to which semiconductor device 10 is to be mounted. The solder balls 38' or other thermally conductive structures permit heat from the semiconductor die 12 to be conducted from an electrically conductive support layer 24 through opening 62 (which may be filled with a suitable electrically conductive material 64 such as copper (Cu), if desired), to an external device (not shown) to which the semiconductor device 10 is mounted. The thermally conductive structures, to avoid shorting if electrical conductivity is not desired, may be formed of a thermally conductive but electrically insulative epoxy or other suitable material.

Figure 4:
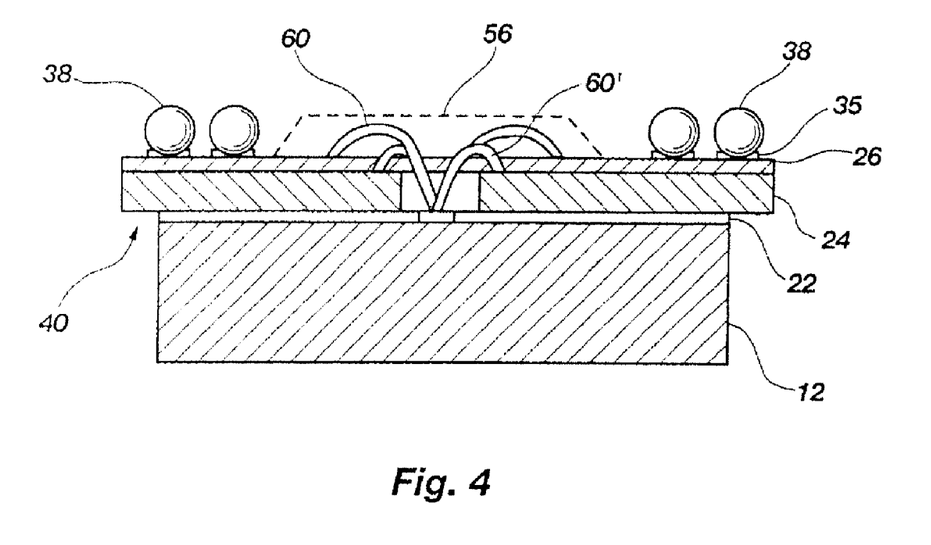
FIG. 4 is a cross-sectional view of the semiconductor package of FIG. 3, taken along line 4-4.

Following the formation or positioning of intermediate conductive elements 60, it may be desirable to encapsulate the intermediate conductive elements 60 and any of the exposed regions of the semiconductor die 12. Encapsulation serves a variety of functions, including sealing the encapsulated surfaces from moisture and contamination, protecting the intermediate conductive elements 60 and other components from corrosion and mechanical shock and supporting the intermediate conductive elements 60. Encapsulants may be deposited on the desired regions to encapsulate portions of the semiconductor die 12 and intermediate conductive elements 60. The material used for the encapsulant may comprise a flowable or moldable dielectric material. For example, a transfer-molded encapsulant 56 (as shown in FIG. 4) forming a so-called "wire bond cap" may be formed over the wire bonds for protection. Transfer-molded encapsulants 56 comprise a silicon particle-filled thermoplastic polymer. Alternatively, a glob-top encapsulation approach using silicon or an epoxy may be employed. Of course, as known in the art, the back surface and sides of semiconductor die 12 may be encapsulated as well. Simultaneous encapsulation by, for example, forming a wire bond cap at the same time the semiconductor die 12 is encapsulated may be preferred but not required. Other techniques, such as injection molding and pot molding, may also be used for encapsulation.

Once assembly is completed, either before or after encapsulation, individual semiconductor devices 10 may be separated from one another, as known in the art (e.g., with an appropriate saw). By way of example, and not to limit the scope of the present invention, machine vision equipment may identify the locations along a circuitry-bearing tape 100 or 100' that are to be cut by "recognizing" patterns of electrically conductive traces 34 and or solder balls 38 or other discrete conductive elements or adjacent segments 18 viewed on the circuitry-bearing tapes 100 or 100' or by "recognizing" encapsulated areas or fiducial marks along the circuitry-bearing tapes 100 or 100'. Other conventional cutting techniques may also be used. The circuitry-bearing tapes 100 and 100' of the present invention are manufactured to a desired width such that only lengthwise separation is necessary.

With reference again to FIG. 3, a semiconductor device 10 of the present invention is shown which includes two complementary segments 18a, 18b of circuitry-bearing tape applied to the active surface 14 of the semiconductor die 12. The segments 18a, 18b are spaced from one another on opposite lateral sides of the central region 20 of the active surface 14 and extend the substantial length L of the semiconductor die 12 in substantially parallel orientation to one another. Although the lengths of segments 18a and 18b are depicted in FIG. 3 as being substantially the same as length L, segments 18 that are longer or shorter than the semiconductor die 12 to which they are to be secured are also within the scope of the present invention. The central region 20 of the active surface 14 includes a plurality of bond pads 16 (e.g., aluminum bond pads) thereon which are in electrical communication with integrated circuitry (not shown) of semiconductor die 12. Bond pads 16 may be formed of aluminum (Al), copper (Cu), and/or other suitable materials.

The bond pads 16 of semiconductor device 10 are shown in two substantially parallel rows substantially equally spaced from a line A, which is located substantially centrally upon the active surface 14 of the semiconductor die 12 and extends longitudinally so as to bisect the active surface 14 into two sections. This orientation provides for minimized power, ground and signal paths to integrated circuitry within the semiconductor die 12. However, it will be understood and appreciated by those of ordinary skill in the art that a variety of bond pad arrangements may be utilized, for instance, a single, central row of bond pads 16.

The bond pads 16 of semiconductor device 10 are shown in two substantially parallel rows substantially equally spaced from line A which is located substantially centrally upon the active surface 14 of the semiconductor die 12 and extends longitudinally so as to bisect the active surface 14 into two sections. This orientation provides for minimized power, ground and signal paths to integrated circuitry within the semiconductor die 12. However, it will be understood and appreciated by those of ordinary skill in the art that a variety of bond pad arrangements may be utilized, for instance, a single, row of bond pads 16.

The substantially parallel attachment of two spaced-apart segments 18 of circuitry-bearing tape leaves the active surface 14 of the semiconductor die 12 in the central region 20 exposed between the two flanking segments 18, thus leaving the bond pads 16 exposed. In this arrangement, the support layer 24, if formed from a suitable, thermally conductive material, may be used to provide heat sink properties and, thus, spread or dissipate heat from the active surface 14 of the semiconductor die 12. The adhesive layer 22 may also be formed from a thermally conductive material, such that it does not substantially prevent heat from dissipating from the active surface 14 of the semiconductor die 12 to a support layer 24 formed from a thermally conductive material.

Intermediate conductive elements 60, such as the depicted bond wires, are secured to the bond pads 16 on the active surface 14 and in communication with the electrically conductive traces 34 formed on the top surface 36 of the electrically insulating layer 26 electrically connecting the bond pads 16 to respective redistributed bond pads 35 and any electrically discrete conductive elements 38, such as the illustrated solder balls, thereon. The segments 18a, 18b utilized in the semiconductor device 10 of FIG. 3 are in accordance with the embodiment of FIG. 2. Thus, an exposed conductive region 44 is provided on each lateral side of the central region 20 of the active surface 14. Intermediate conductive elements 60', such as bond wires, may be electrically connected to one or more bond pads 16' on active surface 14 of semiconductor die 12 and connected directly to the exposed conductive regions 44 or to wire bond pads 50 thereon, which may be formed as known in the art to comprise suitable wire bondable regions. Thus, an electrically conductive support layer 24 may comprise a ground plane.

Intermediate conductive elements 60, such as the depicted bond wires, are secured to the bond pads 16 on the active surface 14 and in communication with the electrically conductive traces 34 formed on the top surface 36 of the electrically insulating layer 26 electrically connecting the bond pads 16 to respective redistributed bond pads 35 and any electrically discrete conductive elements 38, such as the illustrated solder balls, thereon. The segments 18a, 18b utilized in the semiconductor device 10 of FIG. 3 are in accordance with the embodiment of FIG. 2. Thus, an exposed conductive region 44 is provided on each lateral side of the central region 20 of the active surface 14. Intermediate conductive elements 60, such as bond wires, may be electrically connected to one or more bond pads 16' on active surface 14 of semiconductor die 12 and connected directly to the exposed conductive regions 44 or to wire bond pads 50 thereon, which may be formed as known in the art to comprise suitable wire bondable regions. Thus, an electrically conductive support layer 24 may comprise a ground plane.

As shown in FIG. 5, one or more solder balls or other discrete conductive elements 38 may communicate with an electrically conductive support layer 24 which acts as a ground plane through respective openings 62 formed in electrically insulating layer 26. In an alternative arrangement, the electrically conductive support layer 24 may be connected to the grounded solder ball or other discrete conductive element 38 by way of an intermediate conductive element and corresponding electrically conductive trace 34 and bond pad. By utilizing an electrically conductive support layer 24 as a ground plane connected to one or more grounded bond pads 16' and one or more solder balls or other discrete conductive elements 38, the pattern of the electrically conductive traces 34 on the electrically insulating layer 26 may be simplified, as opposed to requiring an electrically conductive trace 34 for each grounded bond pad 16' of the semiconductor die 12. The grounded solder balls or other discrete conductive elements 38' may be connected to an external ground upon installation in a larger device, e.g., a PCB or PWB (not shown).

As the redistribution and packaging circuitry for each individual semiconductor device 10 is provided on a combination of two or more complementary circuitry-bearing segments 18 which may include indexing holes 19 to facilitate placement thereof by LOC lead frame assembly equipment or lead lock tape placement equipment (also termed decal attach equipment), machine placement of the segments 18 may be effected with an accuracy of about ±50 μm rather than the ±100 μm when conventional pick-and-place methods and devices are used. The term "complementary circuitry-bearing segments," as used herein, means that the combination of all circuitry-bearing segments 18 on the active surface 14 of a single semiconductor die 12 provides the desired complete circuit pattern for connection to external circuitry and that no single segment 18 provides such complete pattern. This prevents misplacement of intermediate conductive elements 60, such as bond wires, by automated wire bonding equipment, and may eliminate the need for individual bond pad alignment examination of the finished semiconductor device 10. Additionally, the support layer 24 or the electrically insulating layer 26 may have alignment or fiducial marks 72 (FIGS. 1 and 2) formed thereon, if desired, to further improve accuracy of alignment, particularly if machine vision systems are used in association with the aforementioned LOC lead frame assembly equipment or lead lock tape placement equipment.

The present invention provides semiconductor devices and methods of manufacturing the same that permit a semiconductor die to be mounted in the manner of a leads-over-chip package (i.e., utilizing LOC assembly or lead lock tape placement equipment) and yet provides contact pads to which solder balls can be mounted in order to form a ball grid array. The use of redistributed bond pad 35 arrangements that facilitate the use of flip-chip type connections may decrease the package footprint, improve surface mountability and provide for greater package densities. The support layer 24 of each semiconductor device 10 according to the present invention provides the desired stiffness for handling of the finished semiconductor device 10. Thus, the need for a separate stiffening structure is eliminated, contributing to a package with a diminished vertical profile. Further, semiconductor devices 10 manufactured according to the methods of the present invention are provided with, if desired, an internal ground plane for grounding the semiconductor device 10. Additionally, use of an electrically conductive support layer 24 may provide an effective electrically and thermally conductive heat sink for heat dissipation.

In conclusion, the present invention is directed to tape-based methods of manufacturing semiconductor devices having ball grid array-type circuitry for electrically connecting integrated circuits to external devices, which may utilize conventional lead frame taping equipment. Further, the present invention relates to ball grid array packages formed in accordance with the disclosed methods.

What is claimed is:

1. A method for applying redistribution circuitry for a semiconductor device assembly to an active surface of a semiconductor die, comprising:
applying a first circuitry-bearing tape segment to a first region of the active surface of the semiconductor die, the first circuitry-bearing tape segment having an electrically insulating layer having a first surface bearing a first circuit portion comprising a first plurality of discrete conductive traces and an opposing second surface, and a support layer adjacent the opposing second surface of the electrically insulating layer; and
applying a second circuitry-bearing tape segment to a second region of the active surface of the semiconductor die, the second circuitry-bearing tape segment having a electrically insulating layer having first surface bearing a second circuit portion comprising a second plurality of discrete conductive traces and an opposing second surface, and a support layer adjacent the opposing second surface of the electrically insulating layer, and wherein the first and second circuit portions together form a redistributed electrical connection pattern for the semiconductor device assembly.

2. The method of claim 1, further comprising:
electrically connecting bond pads of the semiconductor die to corresponding circuits of the first and second circuit portions.

3. The method of claim 2, further comprising:
at least partially encapsulating the semiconductor device assembly.

4. The method of claim 1, wherein applying the first and second circuitry-bearing tape segments comprises employing at least one of leads-over-chip lead frame assembly equipment and lead lock tape assembly equipment.

5. The method of claim 1, wherein applying the first and second circuitry-bearing tape segments comprises adhering the first and second tape segments to the active surface of the semiconductor die.

6. The method of claim 1, wherein applying the first and second circuitry-bearing tape segments comprises applying the first and second circuitry-bearing tape segments with the support layer comprising an electrically conductive material.

7. The method of claim 6, further comprising electrically connecting at least one ground bond pad of the semiconductor die to the support layer.

8. The method of claim 6, further comprising:
forming at least one discrete conductive element on at least one of the first and second circuitry-bearing tape segments in electrical communication with the support layer.

9. The method of claim 1, further comprising:
forming electrically discrete conductive elements on at least some redistributed bond pads associated with at least one of the first and second circuit portions.

10. The method of claim 1, wherein applying the first and second circuitry-bearing tape segments comprises applying the first and second circuitry-bearing tape segment having the electrically insulating layer that comprises electrically conductive traces and redistributed bond pads.

11. The method of claim 1, wherein applying the first and second circuitry-bearing tape segments comprises applying the first and second circuitry-bearing tape segments with the electrically insulating layer comprising an electrically insulating material.

12. The method of claim 1, wherein applying the first and second circuitry-bearing tape segments comprises applying the first and second circuitry-bearing tape segments with the support layer comprising copper or aluminum.

13. The method of claim 1, wherein applying the first and second circuitry-bearing tape segments comprises applying the first and second circuitry-bearing tape segments with the electrically insulating layer comprising a polyimide material.

14. A method for forming redistribution circuitry for a semiconductor device assembly, comprising:
providing a tape segment of electrically insulating material, the tape segment having a first surface and an opposing second surface;
forming a plurality of discrete conductive traces and redistributed bond pads in a single row on the first surface of the tape segment; and
securing at least a portion of the second surface of the tape segment to at least one support layer.

15. The method of claim 14, wherein providing the tape segment of electrically insulating material comprises providing the tape segment comprising a polymer.

16. The method of claim 15, wherein providing the tape segment comprising a polymer comprises providing the tape segment comprising a polyimide.

17. The method of claim 14, wherein forming a plurality of conductive traces and redistributed bond pads on the tape segment comprises applying at least one layer comprising electrically conductive material on the tape segment.

18. The method of claim 17, wherein the forming further comprises patterning the at least one layer to form the conductive traces and the redistributed bond pads.

19. The method of claim 14, wherein securing the tape segment to the at least one support layer comprises securing the tape segment to at least one electrically conductive support layer.

20. The method of claim 19, wherein securing the tape segment to the at least one electrically conductive support layer comprises securing the tape segment to a layer comprising copper.

21. The method of claim 19, further comprising:
forming at least one aperture through the tape segment to expose the at least one electrically conductive support layer therethrough.

22. The method of claim 14, wherein securing the tape segment to the at least one support layer comprises securing the tape segment to the at least one support layer including indexing holes adjacent to at least one edge thereof.

23. The method of claim 14, further comprising:
applying an adhesive layer to at least a portion of a surface of the support layer opposite from the tape segment.

24. The method of claim 23, further comprising:
applying a removable liner to an exposed surface of the adhesive layer.

25. The method of claim 14, wherein forming a plurality of conductive traces and redistributed bond pads on the tape segment comprises forming a plurality of circuit and connection patterns on a corresponding plurality of segments of the tape.

26. The method of claim 25, wherein forming a plurality of circuit and connection patterns comprises forming at least two different circuit and connection patterns on the tape segment.

27. The method of claim 14, wherein forming a plurality of conductive traces and redistributed bond pads on the tape segment comprises forming at least one circuit and connection pattern which comprises only a portion of redistribution circuitry for the semiconductor device assembly.

28. A method for applying redistribution circuitry for a semiconductor device assembly to an active surface of a semiconductor die, comprising:
applying a first circuitry-bearing tape segment to a first region of the active surface of the semiconductor die, the first circuitry-bearing tape segment having a first circuit portion on a top surface of the first tape segment; and
applying a second circuitry-bearing tape segment to a second region of the active surface of the semiconductor die, the second circuitry-bearing tape segment having a second circuit portion on a top surface of the second tape segment, wherein the first and second circuit portions together forming a redistributed electrical connection pattern for the semiconductor device assembly, and wherein applying the first and second circuitry-bearing tape segments comprises applying the first and second circuitry-bearing tape segments each having a circuitry-bearing, electrically insulating layer and a support layer comprising an electrically conductive material adjacent the circuitry-bearing, electrically insulating layer.

29. The method of claim 28, further comprising electrically connecting at least one ground bond pad of the semiconductor die to the support layer.

30. The method of claim 28, further comprising:
forming at least one discrete conductive element on at least one of the first and second circuitry-bearing tape segments in electrical communication with the support layer.

31. A method for forming redistribution circuitry for a semiconductor device assembly, comprising:
providing a tape segment of electrically insulating material;
forming a plurality of conductive traces and redistributed bond pads in a single row on a top surface of the tape segment;
securing the tape segment to at least one electrically conductive support layer; and
securing the at least one electrically conductive support layer to an active surface of the semiconductor device with at least a portion of the plurality of conductive traces overlying the active surface of the semiconductor device with the electrically conductive support layer disposed therebetween.

32. The method of claim 31, wherein securing the tape segment to the at least one electrically conductive support layer comprises securing the tape segment to a layer comprising copper.

33. The method of claim 31, further comprising:
forming at least one aperture through the tape segment to expose the at least one electrically conductive support layer therethrough.

34. A method for forming redistribution circuitry for a semiconductor device assembly, comprising:
providing a tape segment of electrically insulating material;
forming a plurality of conductive traces and redistributed bond pads on a top surface of the tape segment; and
securing the tape segment to at least one support layer including indexing holes adjacent to at least one edge thereof to facilitate placement of the tape segment.

* * * * *